(12) United States Patent
MacDonald

(10) Patent No.: US 6,538,191 B1
(45) Date of Patent: Mar. 25, 2003

(54) PHOTOCELL WITH FLUORESCENT CONVERSION LAYER

(75) Inventor: Stuart G. MacDonald, Pultneyville, NY (US)

(73) Assignee: Biomed Solutions, LLC, West Henrietta, NY (US)

( * ) Notice: Subject to any disclaimer, the term of this patent is extended or adjusted under 35 U.S.C. 154(b) by 0 days.

(21) Appl. No.: 09/964,095

(22) Filed: Sep. 26, 2001

(51) Int. Cl.[7] ............................................. H01L 31/055
(52) U.S. Cl. ..................... 136/247; 136/257; 136/259
(58) Field of Search ................................ 136/246, 247, 136/254, 257, 259; 257/435–437

(56) References Cited

U.S. PATENT DOCUMENTS

| | | | | |
|---|---|---|---|---|
| 4,127,425 A | * | 11/1978 | Chambers | 136/247 |
| 4,149,902 A | * | 4/1979 | Mauer et al. | 136/247 |
| 4,175,982 A | * | 11/1979 | Loutfy et al. | 136/255 |
| 4,329,535 A | * | 5/1982 | Rapp | 136/259 |
| 4,357,486 A | * | 11/1982 | Blieden et al. | 136/247 |
| 5,344,499 A | * | 9/1994 | Kanbara et al. | 136/258 |
| 5,449,413 A | * | 9/1995 | Beauchamp et al. | 136/257 |
| 5,816,238 A | * | 10/1998 | Burns et al. | 126/569 |

* cited by examiner

Primary Examiner—Nam Nguyen
Assistant Examiner—Brian L Mutschler
(74) Attorney, Agent, or Firm—Greenwald & Basch LLP; Howard J. Greenwald

(57) ABSTRACT

A photocell device having enhanced conversion efficiency. The device is adapted to convert light energy to electrical energy in a semiconductor layer, to convert a first, monochromatic light, to a second light of different wavelength, in a fluorescent layer, to transmit the first light through a hot mirror layer, to reflect light from the hot mirror layer, and to reflect light from a mirror layer disposed at a second surface of the device.

17 Claims, 2 Drawing Sheets

PHOTOCELL WITH FLUORESCENT CONVERSION LAYER

FIELD OF THE INVENTION

A process for converting light to electricity at an efficiency of at least about fifty percent.

BACKGROUND OF THE INVENTION

Commercially available prior art devices for converting light to electricity are relatively inefficient. These commercially available devices include photocells, which are characterized by the efficiency with which they can convert incident light energy to useful electrical energy. In general, such efficiency does not exceed about 23 percent. Thus, as is disclosed in U.S. Pat. No. 6,278,055, ". . . photosensitive optoelectronic devices have been constructed of a number of inorganic semiconductors . . . Solar cells are characterized by the efficiency with which they can convert incident solar power to useful electric power. Devices utilizing crystalline or amorphous silicon dominate commercial applications and some have achieved efficiencies of 23% or greater. However, efficient crystalline-based devices, especially of large surface area, are difficult and expensive to produce due to the problems inherent in producing large crystals without significant efficiency-degrading defects."

It is an object of this invention to provide a process for converting light to electricity which is substantially more efficient and reliable than prior art processes.

SUMMARY OF THE INVENTION

In accordance with this invention, there is provided a process comprising the steps of: transmitting light at a first wavelength through a first optical layer, transmitting said light with said first wavelength through a photocell element and a second optical layer, converting said light with said first wavelength while it is within said second optical layer to light with a second wavelength, reflecting said light with a second wavelength from a mirror, transmitting said light with a second wavelength which has been internally reflected by said mirror through said photocell element and said second optical layer to said first optical layer, and internally reflecting said light with a second wavelength which has been internally reflected by said mirror through said photocell element from said first optical layer.

BRIEF DESCRIPTION OF THE DRAWINGS

The invention will be described by reference to the following drawings, in which like numerals refer to like elements, and in which.

DESCRIPTION OF THE PREFERRED EMBODIMENTS

Figure 1:
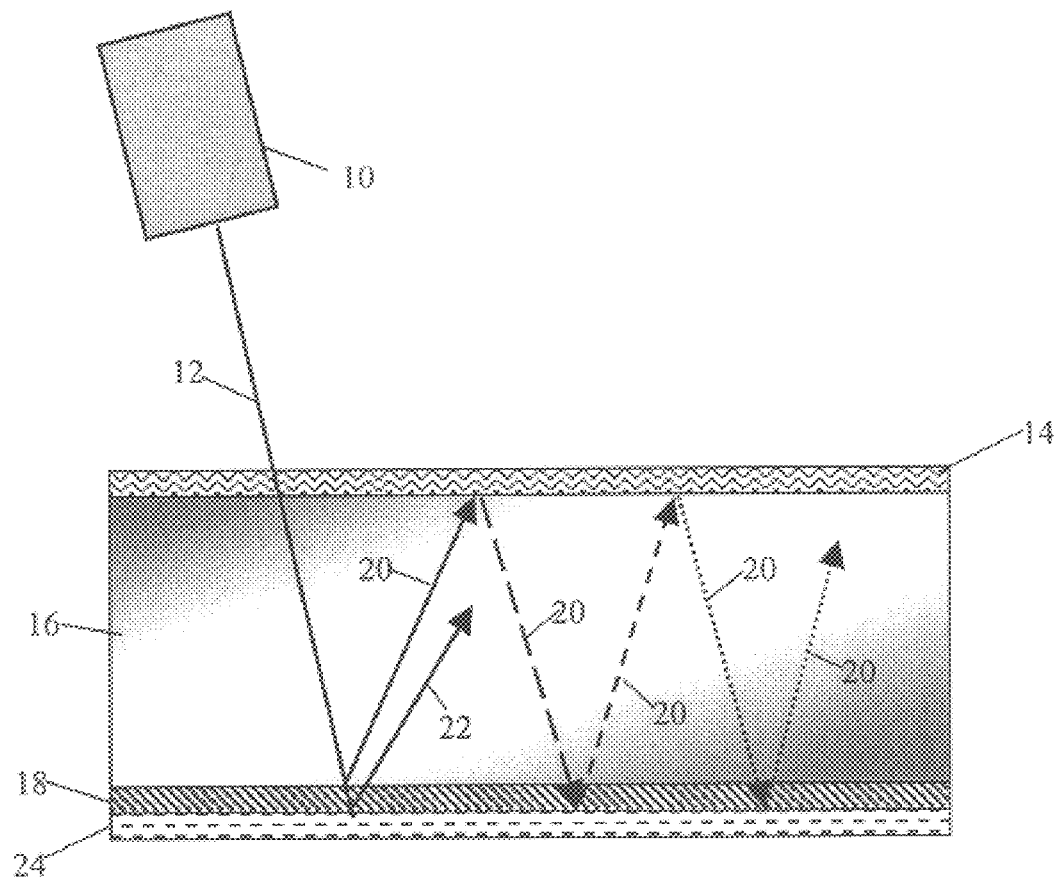
FIG. 1 is a schematic diagram illustrating one preferred process of the invention.

The process of this invention provides increased conversion of light to electricity. This efficiency, often referred to as "conversion efficiency," refers to the efficiency of the process of converting light energy to electrical energy within a photovoltaic device.

Photocells are characterized by the efficiency with which they can convert incident light energy to useful electrical energy. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. More recent efforts have focused on the use of organic photovoltaic cells to achieve acceptable photovoltaic conversion efficiencies with economical production costs, but in general the materials used in these devices are not reliable over a long period of time.

Semiconductors that convert photons into electrical energy do so due to their having a conduction band and a valence band that are separated by an energy gap, $E_g$, that varies with material composition and temperature. When a photon is absorbed by a semiconductor, an electron is promoted from the valence band into the conduction band, thereby creating a hole in the valence band. Since a hole represents the absence of an electron, it can be regarded as a positive charge carrier. When donor or n-type impurities (which increase the number of electrons available to carry current) are added to one side of a semiconductor crystal and acceptor or p-type impurities (which increase the number of holes) to the other, a p-n junction is formed that permits current flow in one direction but restrains it in the opposite direction. Thus, p-n junctions are ideal for converting light into electricity.

It will be known to those skilled in the art that a photon of wavelength $\lambda$ (as measured in a vacuum) and frequency $\upsilon$ has an energy $h\upsilon = hc/\lambda$ and can be absorbed by a semiconductor when $h\upsilon \geq E_g$. However, any extra energy in the photon ($h\upsilon - E_g$) is converted into thermal rather than electrical energy, since only one electron-hole pair can be created for each absorption event. On the other hand, a semiconductor is more transparent to wavelengths corresponding to energies less than $E_g$, since in this case the photons are not energetic enough to promote electrons from the valence band into the conduction band. Thus, no single semiconducting material can convert the entire solar spectrum into electrical energy, since the most energetic photons produce largely thermal energy and are therefore inefficiently utilized, while the least energetic photons cannot be absorbed. However, by cascading the p-n junctions of different materials, the overall conversion efficiency can be improved somewhat. In so-called "tandem" solar cells, a top cell having a p-n junction of a high-energy band gap semiconductor intercepts the most energetic photons. Lower energy photons pass through the top cell before they enter another cell having a p-n junction of a lower energy band gap semiconductor. In this way, an additional portion of the solar spectrum is used. Prior art devices, such as the device disclosed in U.S. Pat. No. 5,853,497 make use of multiple photovoltaic layers to take advantage of the above factors, but they typically are restricted to a small number of layers due to the complexity of manufacture and the lower manufacturing yields associated with more complex structures. The entire disclosure of this United States patent is hereby incorporated by reference into this specification.

Other prior art devices relate to use of fluorescent materials to convert solar radiation to higher wavelengths that are more efficiently converted to electricity by photovoltaic devices. One such device, disclosed in U.S. Pat. No. 4,367,367, makes use of large glass sheets that are doped with a fluorescent material and utilize a photovoltaic device affixed to one edge, the other edges being coated with a reflective mirror. As can be seen from a study of this U.S. Pat. No. 4,367,367, this configuration results in a high degree of attenuation of light in the glass sheet, and the resulting low conversion efficiency cited in the patent (under 5%) is not unexpected. The entire disclosure of this United States patent is hereby incorporated by reference into this specification.

In one embodiment of the instant invention, there is provided an enhanced photocell device for converting optical energy to electrical energy, said photocell device having one or more optical layers and/or thin-film coatings which improve conversion efficiency by means of light reflection, wavelength translation, and light trapping within the photocell device.

In one embodiment, the device of this invention is incorporated into an energy transmission system wherein 1) the coupling efficiency from a light transmission means into a photocell, and 2) the conversion efficiency of light energy to electrical energy within the photocell, are of primary importance. However, this invention may be applied to any system wherein light energy is being coupled into a conversion device, including non-semiconductor photovoltaic devices, photoresistive devices, photodiode devices, semiconductor communications devices, and the like. Thus, by way of illustration, one may use this invention with any of the photovoltaic devices disclosed in U.S. Pat. Nos. 5,424,223, 5,341,008, 5,330,918 (method of forming a high voltage silicon-on-saphire photocell array), U.S. Pat. No. 5,330,585 (gallium arsenide/aluminum gallium arsenide photocell including environmentally sealed ohmic contact grid interface and method of fabricating the cell), U.S. Pat. Nos. 5,206,534, 5,072,109 (photocell array with multi-spectral filter), U.S. Pat. Nos. 6,281,428, 6,268,223, 6,265,653 (high voltage photovoltaic power converter), U.S. Pat. No. 6,261,862 (process for producing photovoltaic element), U.S. Pat. Nos. 6,252,158, 6,252,157 (amorphous silicon-based thin film photovoltaic device), U.S. Pat. Nos. 6,242,686, 6,211,454 (photovoltaic element), U.S. Pat. Nos. 6,184,456, 6,180,870, 6,166,319 (multi-junction photovoltaic device with monocrystalline I-layer), U.S. Pat. Nos. 6,162,988, 6,159,736, and the like. The entire disclosure of each of these United States patents is hereby incorporated by reference into this specification.

FIG. 1 is a schematic representation of one preferred embodiment of the invention. Referring to FIG. 1, a light source 10 emits lights rays 12 through a first optical layer 14, a photocell assembly 16, and a fluorescent layer 18. The light rays 12 passing through fluorescent layer 18 are divided into two light rays 20 and 22, each of which have a different wavelength than light rays 12. The light rays 20 and 22 reflect off of mirror 24 and also pass through photocell assembly 16 within which at least part of their photonic energy is converted into electrical energy. Those portions of the light rays 20 and 22 which are not absorbed by the photocell assembly 16 are then internally reflected from first optical layer 14.

The light source 10 preferably emits monochromatic light. As used herein the term monochromatic light refers to light which consists of a single wavelength or a very narrow band of wavelengths. Reference may be had, e.g., to U.S. Pat. Nos. 6,291,184, 6,291,151, 6,290,382, 6,288,815, 6,285,345, 6,283,597, 6,282,438, 6,282,013, 6,281,491, 6,276,798, 6.275,251, 6,274,860, 6,272,440, 6,271,913, 6,266,167, 6,264,470, 6,263,291, 6,262,710, 6,256,530, and the like. The entire disclosure of each of these United States patents is hereby incorporated by reference into this specification.

By way of illustration and not limitation, the monochromatic light used in the process of this invention has a half-power bandwidth of less than about 50 nanometers and, more preferably, less than about 25 nanometers. As is known to those skilled in the art, half power bandwidth refers to the range of wavelengths where the energy of the light source is above 50 percent of its peak value. Reference may be had, e.g., to U.S. Pat. Nos. 6,061,140, 5,959,773, 5,703,364, 5,233,197, 5,218,207, 5,173,274, 5,086,229, 5,028,787, 4,990,772, 4,967,090, 4,959,551, and the like. The entire disclosure of each of these United States patents is hereby incorporated by reference into this specification.

In one embodiment, the monochromatic light has a wavelength of less than about 600 nanometers and, preferably, has wavelengths ranging from about 400 nanometers to about 575 nanometers.

One may use any of the prior art devices adapted to produce such monochromatic light. Thus, by way of illustration and not limitation, one may use a Melles Griot DPSS Laser, model number 58GIL, which is sold by the Melles Griot Company of Carlsband, Calif. and emits monochromatic light with a wavelength of 523 nanometers.

Thus, by way of further illustration, one may use a light-emitting diode to produce the monochromatic light 12. Alternatively, one may use a filtered incandescent source to produce the light 12. Other sources of such monochromatic light are well known to those skilled in the art.

Referring again to FIG. 1, the monochromatic light 12 is caused to contact and pass through hot mirror 14. As is known to those skilled in the art, a hot mirror is a mirror that preferentially transmits at least 80 percent light below a certain wavelength, and preferentially reflects at least 80 percent of light above a certain wavelength. Thus, e.g. the hot mirror 14 may preferentially transmit at least 80 percent of light with a wavelength from from about 400 to about 700 nanometers and preferentially reflects at least 80 percent of light with a wavelength of from about 750 nanometers to about 1500 nanometers and above. Reference may be had, e.g., to U.S. Pat. Nos. 6,275,602, 6,249,348, 6,246,479, 6,220,713, 6,185,041, 6,117,530, 5,982,078, 5,962,114, 5,923,471, 5,882,774, 5,857,768, 5,795,708, and the like. The entire disclosure of each of these United States patents is hereby incorporated by reference into this specification.

By way of further illustration, hot mirror 14 may be, e.g., the "hot mirror" sold as catalog number HM-25.4 by the Quantum Optics Company of Pomfret; Conn. This "hot mirror" transmits 90 percent at most wavelengths of light below 675 nanometers, and it reflects 90 percent of light above 750 nanometers.

By way of further illustration, hot mirror 14 may be, e.g., the "hot mirror" sold by the Melles Griot Company as catalog number 03MHG007.

In one preferred embodiment, the hot mirror 14 transmits at least about 95 percent of light in a band below 675 nanometers and reflects at least about 97 percent of light in a band above 750 nanometers, wherein each of said bands has a half power bandwidth of less than 100 nanometers. In one preferred embodiment, each of said bands has a half power bandwidth of less than about 50 nanometers.

By way of yet further illustration, and in one preferred embodiment, the hot mirror transmits at least about 95 percent of light in a band below 550 nanometers and reflects at least about 95 percent of light in a band above 550 nanometers.

Referring again to FIG. 1, and in the preferred embodiment depicted therein, after the light 12 passes through the hot mirror 14, it then passes through photocell element 16. As is known to those skilled in the art, a photocell is a device designed to provide an electric output that corresponds to the radiation that is incident upon the device. Reference may be had, e.g., to U.S. Pat. Nos. 6,278,055, 6,198,092, 6,198,091, 6,091,017, 5,868,869, 5,853,497, 5,720,827, 5,714,012, 5,674,325, 4,629,821, and the like. The entire disclosure of each of these United States patents is hereby incorporated by reference into this specification.

As is know to those skilled in the art, one can custom design a hot mirror with specified optical properties. The hot mirror utilizes a short-wavelength pass filter stack design of the basic form 1.6 (0.5L H 0.5L)$^n$ wherein: H=QWOT of high index material, L=QWOT of low index material, and n is equal to the number of layers of material in the hot mirror.

Commercially available hot mirrors typically have a transition between near total transmission and near total reflection at a wavelength of about 700 nanometers. However, these characteristics can be custom modified using the aforementioned formula to effect a transition wavelength of, e.g., 600 nanometers.

By way of illustration, one may use the photocell depicted in U.S. Pat. No. 5,342,451; the entire disclosure of this United States patent is hereby incorporated by reference into this specification. The figures of this patent depict a series of semiconductor layers contained in a photovoltaic cell. In the device of this patent, there is depicted a substrate which is covered by a buffer layer, and a two-part active layer comprising an 'n' base and a 'p' emitter. These layers are in turn covered by a window. In such device, there is an additional conducting layer that is not required for the photocell operation but which improves the efficiency of the photocell by providing a path for electron flow that has substantially reduced lateral resistivity than the emitter layer in combination with the window. Thus the photocell element may be considered as an individual functional element rather than a complex multilayer construct.

Referring again to FIG. 1, it will be apparent that some of the light 12 is absorbed by the photocell element 16 and converted into electricity. However, some of the light 12 is transmitted through the photocell element 16 and contacts a fluorescent layer 18.

Fluorescent layer 18 preferably contains a fluorescent dye which effects a "Stokes shift" on light 12. As is known to those skilled in the art, a Stokes shift is the displacement of spectal lines or bands of luminescent radiation toward longer wavelengths than those of the absorption lines or bands. Reference may be had, e.g., to U.S. Pat. Nos. 6,287,765, 6,277,984, 6,274,065, 6,259,104, 6,251,687, 6,242,430, 6,238,931, 6,211,954, 6,207,464, 6,198,107, 6,174,424, 6,166,385, 6,140,051, 6,138,800, 6,130,094, and the like. The entire disclosure of each of these United States patents is hereby incorporated by reference into this specification.

As is known to those skilled in the art, fluorescent dyes often effect a Stokes shift upon incident radiation. Without wishing to be bound to any particular theory, applicant believes that this phenomenon occurs because the excitation light dissipates its energy by raising an electron in the fluorescent material to a higher orbital as such light is absorbed. However, there is excess energy that is dissipated thermally. Upon relaxation from the higher orbital state, the electron release a photon having a lower energy state. This released photon with a lower energy state exhibits itself as a wave with longer wavelength. The Stokes shift is the difference between the wavelength of the incident light and the emitted light.

In one aspect of the preferred embodiment illustrated in FIG. 1, the incident light 12 has a wavelength of about 530 nanometers, and the emitted has a wavelength of about 570 nanometers. As will be apparent, by choosing different fluorescent materials and/or different thicknesses of fluorescent materials, one can effect different Stokes shifts.

Fluorescent materials which effect different Stokes shifts are well known to those skilled in the art. Reference may be had, e.g., to U.S. Pat. Nos. 6,214,563, 6,210,910, 6,207,831, 6,205,281, 6,200,762, 6,192,261, 6,180,354, 6,141,096, and the like. The entire disclosure of each of these United States patents is hereby incorporated by reference into this specification.

As is known to those skilled in the art, fluorescent materials are characterized by having both a peak excitation wavelength and a peak emission wavelength. Reference may be had, e.g., to The "Handbook of Fluorescent Probes and Research Chemicals" which is published by Molecular Probes, Inc. of Eugene Oreg. Much information about flurochromes also will be found in a book edited by Taylor, Wang, and Yu-Li entitled "Fluorescence: Miscrocopy of Living Cells in Culture, Parts A and B (Academic Press, New York, 1989). Reference also may be had to publications by the Omega Optical Company and the Chroma Technology Company.

Thus, by way of illustration, one may use one or more of the following fluorescent materials: (1) 7-aminoactinomycin D-AAD, with an excitation wavelength of 546 nanometers and an emission wavelength of 647 nanometers, (2) Astrazon Red 6B, with an excitation wavelength of 520 nanometers and an emission wavelength of 595 nanometers, (3) Genacryl Brilliant Red B, with an excitation wavelength of 520 nanometers and an emission wavelength of 590 nanometers, (4) Magdala Red, with an excitation wavelength of 524 nanometers and an emission wavelength of 600 nanometers, and the like. These fluorescent materials are well known to those skilled in the art and are presented in a table entitled "Flurochrome Data Tables: Exitation/ Emission Wavelenghts Listed by Flurochrome," which was prepared by Michael W. Davidson, Mortimer Abramovitz, Olympus America Inc., and The Florida State University.

As will be apparent to those skilled in the art, depending upon the excitation energy of the fluorescent material used, one will preferably use a light source which will effectively excite the fluorescent material and cause it to emit at its emission wavelength. Thus, by way of illustration and not limitation, for a fluorescent material which is excited at a wavelength of about 532 nanometers, one may advantageously use a laser sold as the "Green Diode-Pumped Solid State Laser Module," as part number L54-550, by the Edmund Industrial Optics Company of 101 East Gloucester Pike, Barrington, N.J. 08007; this laser light source emits light at a wavelength of 532 nanometers, plus or minus 5 nanomters. Alternatively, or additionally, one may use a light emitting diode which contains gallium phosphide and which emits radiation at a wavelength of about 0.55 microns; see, e.g., page 106 of Harry Dutton's "Understanding Optical Communications" (Prentice Hall PTR, Upper Saddle River, N.J. 1998). Alternatively, or additionally, one may use a light emitting diode which consists essentially of gallium arsenide, that has a spectral emission of 540 nanometers, a half power bandwidth of 3 nanometers, and a green color; see, e.g., page 11–10 of Donald G. Fink's "Electronics Engineers' Handbook," Second Edition (McGraw-Hill Book Company, New York, N.Y. 1982). Other suitable light sources, and/or combinations of light sources, will be apparent to those skilled in the art.

It is preferred that the Stokes shift effected by optical layer 18 be at least 100 nanometers.

As will be apparent to those skilled in the art, the device of FIG. 1 (and of FIG. 2) acts as a light trap, shifting some or all of the incident light to a wavelength wherein it will be totally internally reflected until complete conversion of such light is effected by the conversion of such light to electricity. This light trap feature substantially increases the efficiency of the utilization of the incident light.

Figure 2:
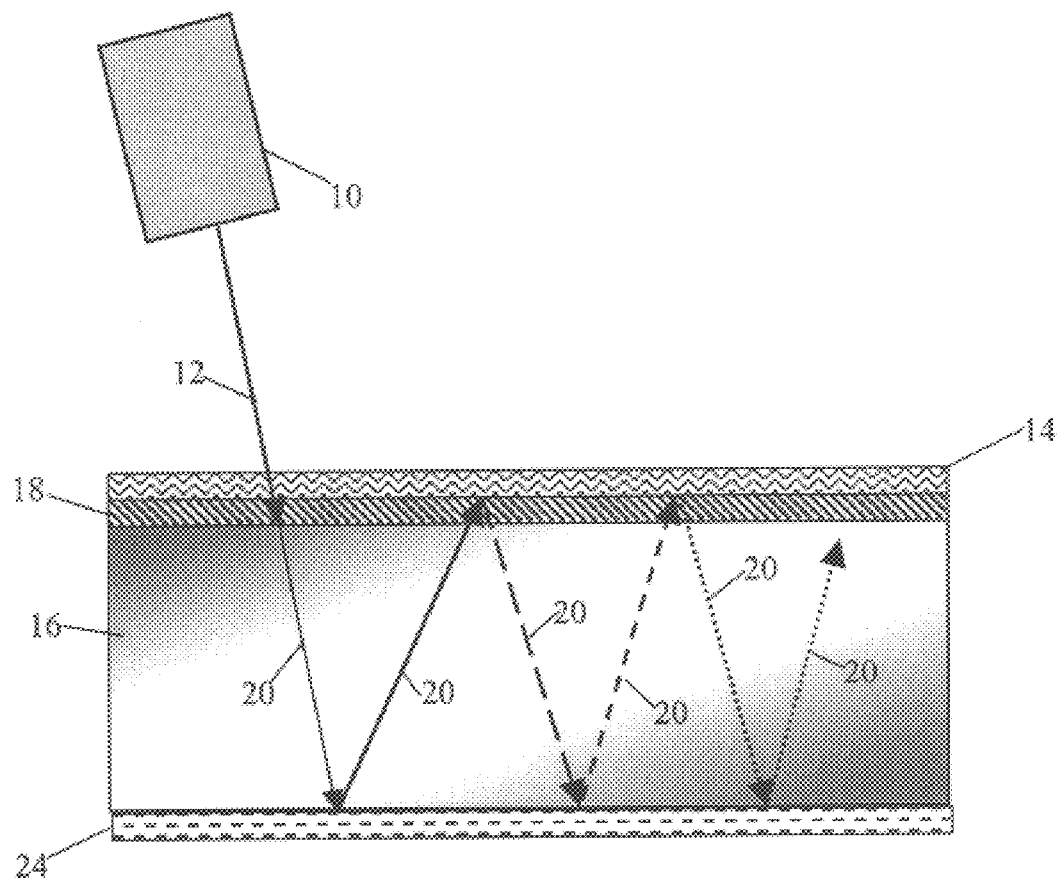
FIG. 2 is a schematic diagram illustrating a second preferred process of the invention.

FIG. 2 is a schematic diagram of another preferred process of the invention which is similar to the process depicted in FIG. 1 but differs therefrom in that layer 18 is disposed immediately adjacent to hot mirror 14 instead of being disposed adjacent to mirror 24.

It is to be understood that the aforementioned description is illustrative only and that changes can be made in the apparatus, in the sequence and combination of elements of said apparatus, as well as in other aspects of thee invention discussed herein, without departing from the scope of the invention as defined in the following claims.

I claim:

1. A photocell assembly having enhanced conversion efficiency, comprising a source of monochromatic light energy that emits monochromatic light with a wavelength of about 400 to about 575 nanometers, and a photoconverter device, wherein said photoconverter device is comprised of means for converting said monochromatic light energy to electrical energy in a semiconductor layer, means for converting a first, monochromatic light, to a second light of different wavelength, in a fluorescent layer, means for transmitting said first light through a hot mirror layer at a first surface of said device, means internally for reflecting said second light from said hot mirror layer, and means for internally reflecting said first and said second light from a mirror layer disposed at a second surface of said device, wherein:

(a) said means for converting said monochromatic light energy to electrical energy in a semiconductor layer is disposed between said hot mirror layer and said means for converting a first, monochromatic light, to a second light of different wavelength in a fluorescent layer;
   (b) said source of monochromatic light energy is disposed external to said photoconverter device;
   (c) said photocell device assembly is comprised of means for contacting said monochromatic light energy with said hot mirror layer and for transmitting at least 80 percent of said monochromatic light energy through said hot mirror layer;
   (d) said fluorescent layer increases said wavelength of said monochromatic light energy by at least about 100 nanometers, to thereby produce shifted wavelength light energy;
   (e) said hot mirror layer reflects at least about 80 percent of said shifted wavelength light energy, thereby producing reflected shifted wavelength light energy; and
   (f) said hot mirror reflects at least about 80 percent of said reflected shifted wavelength light energy.

2. The photocell device as recited in claim 1, wherein said monochromatic light has a half-power bandwidth of less than about 50 nanometers.

3. The photocell device as recited in claim 1, wherein said monochromatic light has a half-power bandwidth of less than about 25 nanometers.

4. The photocell device as recited in claim 1, wherein said source of light energy is a laser diode.

5. The photocell device as recited in claim 1, wherein said source of light energy is a light-emitting diode.

6. The photocell device as recited in claim 1, wherein said hot mirror transmits at least 80 percent of light with a wavelength of from about 400 to about 700 nanometers and reflects at least 80 percent of light with a wavelength of from about 750 to about 1500 nanometers.

7. The photocell device as recited in claim 1, wherein said hot mirror transmits at least 90 percent of light with a wavelength below 675 nanometers and reflects at least 90 percent of light with a wavelength above 750 nanometers.

8. The photocell device as recited in claim 1, wherein said hot mirror transmits at least 95 percent of light with a wavelength less than 675 nanometers and reflects at least 97 percent of light with a wavelength above 750 nanometers.

9. The photocell device as recited in claim 1, wherein said hot mirror transmits at least 95 percent of light with a wavelength less than about 550 nanometers and reflects at least 95 percent of light with a wavelength above 550 nanometers.

10. The photocell device as recited in claim 1, wherein said fluorescent layer is comprised of a fluorescent dye with a peak excitation wavelength and a peak emission wavelengh.

11. The photocell device as recited in claim 10, wherein said light source emits light at a wavelength which is about the same as the peak excitation wavelength of said fluorescent dye.

12. The photocell device as recited in claim 1, wherein said device is comprised of said hot mirror layer and, disposed beneath said hot mirror layer, said semiconductor layer.

13. The photocell device as recited in claim 12, wherein said semiconductor layer is photovoltaic layer.

14. The photocell device as recited in claim 13, wherein said photovoltaic layer is contiguous with said hot mirror layer.

15. The photocell device as recited in claim 14, wherein said fluorescent layer is disposed beneath said photovoltaic layer.

16. The photocell device as recited in claim 13, wherein said fluorescent layer is disposed between said hot mirror and said photovoltaic layer.

17. The photocell device as recited in claim 16, wherein said fluorescent layer is contiguous with said hot mirror layer.

* * * * *